US012785671B2

(12) United States Patent
Kim et al.

(10) Patent No.: US 12,785,671 B2
(45) Date of Patent: Nov. 3, 2026

(54) HIGH-SPEED I/O CIRCUIT FOR DIE-TO-DIE INTERCONNECT FOR SUPPRESSING OVERSHOOT AND UNDERSHOOT

(71) Applicant: ELECTRONICS AND TELECOMMUNICATIONS RESEARCH INSTITUTE, Daejeon (KR)

(72) Inventors: Yi-Gyeong Kim, Daejeon (KR); Young-Su Kwon, Daejeon (KR); Su-Jin Park, Daejeon (KR); Young-Deuk Jeon, Sejong-si (KR); Min-Hyung Cho, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 21 days.

(21) Appl. No.: 18/940,129

(22) Filed: Nov. 7, 2024

(65) Prior Publication Data

US 2025/0158604 A1 May 15, 2025

(30) Foreign Application Priority Data

Nov. 9, 2023 (KR) ........................ 10-2023-0154512
Oct. 10, 2024 (KR) ........................ 10-2024-0137506

(51) Int. Cl.
*H03K 5/125* (2006.01)
*H04B 1/40* (2015.01)

(52) U.S. Cl.
CPC ............... *H03K 5/125* (2013.01); *H04B 1/40* (2013.01)

(58) Field of Classification Search
CPC .................................. H03K 5/125; H04B 1/40
USPC .......................................................... 375/219
See application file for complete search history.

(56) References Cited

U.S. PATENT DOCUMENTS

| | | | | |
|---|---|---|---|---|
| 5,136,949 A * | 8/1992 | Grosch | F42C 15/42 102/221 |
| 9,264,187 B1 | 2/2016 | Sosa et al. | |
| 11,217,284 B2 | 1/2022 | Stave | |
| 11,632,103 B2 | 4/2023 | Marquart et al. | |
| 2002/0026467 A1* | 2/2002 | Ha | H03M 1/1235 708/530 |
| 2015/0318854 A1 | 11/2015 | Shen | |
| 2016/0233854 A1 | 8/2016 | Srivastava et al. | |
| 2017/0222648 A1 | 8/2017 | Lee et al. | |
| 2021/0334143 A1 | 10/2021 | Kim et al. | |
| 2023/0088871 A1 | 3/2023 | Marquart et al. | |
| 2023/0291412 A1 | 9/2023 | Roh et al. | |

FOREIGN PATENT DOCUMENTS

| | | |
|---|---|---|
| CN | 111988001 * | 11/2020 |
| CN | 114647271 * | 6/2022 |
| JP | H1039591 * | 2/1998 |
| KR | 1020160060706 A | 5/2016 |
| KR | 1020230133729 A | 9/2023 |

* cited by examiner

*Primary Examiner* — Leila Malek
(74) *Attorney, Agent, or Firm* — Rabin & Berdo, P.C.

(57) ABSTRACT

Disclosed herein is a high-speed I/O circuit for die-to-die interconnect for suppressing an overshoot and an undershoot. A data reception circuit includes a reception circuit configured to convert a reception signal received from an interconnect into a digital signal, a first clipper circuit configured to suppress an overshoot of the reception signal based on current extraction, and a second clipper circuit configured to suppress an undershoot of the reception signal based on current supply.

14 Claims, 11 Drawing Sheets (A)PMOSFET (B)LEVEL-SHIFTER + PMOSFET (C)AMPLIIFER/COMPARATOR + PMOSFET

HIGH-SPEED I/O CIRCUIT FOR DIE-TO-DIE INTERCONNECT FOR SUPPRESSING OVERSHOOT AND UNDERSHOOT

CROSS REFERENCE TO RELATED APPLICATIONS

This application claims the benefit of Korean Patent Application Nos. 10-2023-0154512, filed Nov. 9, 2023 and 10-2024-0137506, filed Oct. 10, 2024, which are hereby incorporated by reference in their entireties into this application.

BACKGROUND OF THE INVENTION

1. Technical Field

The present disclosure relates generally to a high-speed input/output (I/O) circuit for die-to-die interconnect, and more particularly to a high-speed I/O circuit for die-to-die interconnect for suppressing an overshoot and an undershoot.

2. Description of the Related Art

With the development of an IC packaging technology, integrated circuits (ICs), high bandwidth memories (HBMs) and the like may be manufactured as one package while being connected for wide bandwidth using a plurality of interconnects. This recent packaging technology enables interconnection with a wide bandwidth between an IC (die) and an IC (die) or an HBM and an IC (die) by adopting high-speed data transmission and reception via multiple interconnects and short interconnects. Namely, as the length of an interconnect is short, an input/output (I/O) of an IC may come to use an unterminated I/O capable of reducing power consumption.

This recent packaging technology may use an interposer or an interconnect bridge for implementing high density interconnects. Here, the signal transmission characteristics such as a transmission bandwidth, crosstalk or the like of the interposer or the interconnect bridge may be differed according to a manufacturing process and the structure of transmission lines. For example, an interconnect model of the interposer is shown in FIG. 1.

An die-to-die interconnect RLC model shown in FIG. 1, $R_{TX}$, $C_{TX}$, and $C_{RX}$ are values determined according to an I/O circuit of an IC, and $R_{CH}$, $L_{CH}$, and $C_{CH}$ are determined according to the width, the pitch, or the stack-up configuration of an interposer according to the interconnect density desired to be implemented. Accordingly, the transmission characteristics of the interconnect model may be differed according to the type of the interposer.

For example, when $R_{CH}$ is excessively large, signal transmission shows over-damping characteristics and the eye-diagram of a signal reception unit is reduced. For another example, when the influence of $L_{CH}$ and $C_{CH}$ is large in comparison to $R_{CH}$, under-damping characteristics increase to cause an overshoot and an undershoot and reduce the eye-diagram as shown in FIG. 2.

Here, an overshoot and an undershoot caused by under-damping characteristics deteriorate the reliability of an integrated circuit and lower the stability of transmission signals. However, high density die-to-die interconnects may cause an overshoot and an undershoot due to limited impedance control. Therefore, a high-speed I/O circuit for the die-to-die interconnects requires a technology capable of suppressing the overshoot and the undershoot.

PRIOR ART DOCUMENTS

Patent Documents

U.S. Patent Application Publication No. 2023/0088871, Date of Publication: Mar. 23, 2023 (Title: High-speed voltage clamp for unterminated transmission lines)

SUMMARY OF THE INVENTION

Accordingly, the present disclosure has been made keeping in mind the above problems occurring in the prior art, and an object of the present disclosure is to provide a high-speed I/O circuit for suppressing an overshoot and an undershoot caused by under-damping characteristics during high-speed data transmission and reception via a die-to-die interconnect.

Another object of the present disclosure is to provide a high-speed I/O circuit for improving the stability of transmission signals and the reliability of an integrated circuit by suppressing an overshoot and an undershoot in an I/O circuit of the integrated circuit.

In accordance with an aspect of the present disclosure to accomplish the above objects, there is provided a data reception circuit, including a reception circuit configured to convert a reception signal received from an interconnect into a digital signal; a first clipper circuit configured to suppress an overshoot of the reception signal based on current extraction; and a second clipper circuit configured to suppress an undershoot of the reception signal based on current supply.

The first clipper circuit may include a first sensing port configured to sense a voltage at an input terminal of the reception circuit; and a first current port configured to transfer a current extracted from the input terminal to a ground, wherein when the voltage at the input terminal is higher than a preset upper limit voltage, the first clipper circuit operates to extract the current from the reception signal via the first current port.

The first clipper circuit may correspond to any one of a type operating based on a threshold voltage, a type operating based on a level shifter, or a type operating based on an amplifier or a comparator with a reference voltage set therein.

The upper limit voltage may correspond to a voltage set for determining the overshoot in a preset limit range.

The second clipper circuit may include a second sensing port configured to sense a voltage at an input terminal of the reception circuit; and a second current port configured to transfer a current supplied from a power supply to the input terminal, wherein when the voltage at the input terminal is lower than a preset lower limit voltage, the second clipper circuit operates to supply the current to the reception signal via the second current port.

The second clipper circuit may correspond to any one of a type operating based on a threshold voltage, a type operating based on a level shifter, or a type operating based on an amplifier or a comparator with a reference voltage set therein.

The lower limit voltage may correspond to a voltage set for determining the undershoot in a preset limit range.

In accordance with another aspect of the present disclosure to accomplish the above objects, there is provided a data transmission/reception circuit, including a transmission circuit configured to transmit a transmission signal to an interconnect; a reception circuit configured to convert a reception signal received from the interconnect into a digital signal; a first clipper circuit configured to suppress an overshoot of the reception signal based on current extraction; and a second clipper circuit configured to suppress an undershoot of the reception signal based on current supply.

The data transmission/reception circuit may further include a switch configured to connect the first clipper circuit and the second clipper circuit to an input terminal of the reception circuit during an operation of the reception circuit.

The switch may be closed during the operation of the reception circuit and opened during an operation of the transmission circuit.

The transmission circuit may adjust an output impedance based on a resistance value when an overshoot and undershoot are not suppressible in a reception stage for receiving the transmission signal.

The first clipper circuit may include a first sensing port configured to sense a voltage at an input terminal of the reception circuit; and a first current port configured to transfer the current extracted from the input terminal to a ground, wherein when the voltage at the input terminal is higher than a preset upper limit voltage, the first clipper circuit operates to extract the current from the reception signal via the first current port.

The first clipper circuit may correspond to any one of a type operating based on a threshold voltage, a type operating based on a level shifter, or a type operating based on an amplifier or a comparator with a reference voltage set therein.

The upper limit voltage may correspond to a voltage set for determining the overshoot in a preset limit range.

The second clipper circuit may include a second sensing port configured to sense a voltage at an input terminal of the reception circuit; and a second current port configured to transfer a current supplied from a power supply to the input terminal, wherein when the voltage at the input terminal is lower than a preset lower limit voltage, the second clipper circuit operates to supply the current to the reception signal via the second current port.

The second clipper circuit may correspond to any one of a type operating based on a threshold voltage, a type operating based on a level shifter, or a type operating based on an amplifier or a comparator with a reference voltage set therein.

The lower limit voltage may correspond to a voltage set for determining the undershoot in a preset limit range.

BRIEF DESCRIPTION OF THE DRAWINGS

The above and other objects, features and advantages of the present disclosure will be more clearly understood from the following detailed description taken in conjunction with the accompanying drawings, in which.

DESCRIPTION OF THE PREFERRED EMBODIMENTS

Figure 1:
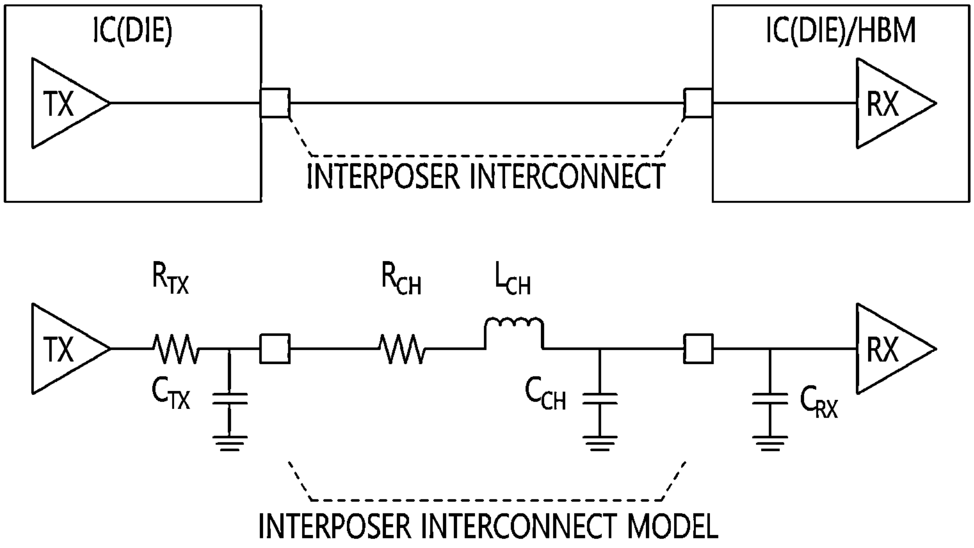
FIG. 1 is a diagram illustrating an example die-to-die interconnect RLC model.

The present disclosure will be described in detail below with reference to the accompanying drawings. Repeated descriptions and descriptions of known functions and configurations which have been deemed to make the gist of the present disclosure unnecessarily obscure will be omitted below. The embodiments of the present disclosure are intended to fully describe the present disclosure to a person having ordinary knowledge in the art to which the present disclosure pertains. Accordingly, the shapes, sizes, etc. of components in the drawings may be exaggerated to make the description clearer.

In the present specification, each of phrases such as "A or B", "at least one of A and B", "at least one of A or B", "A, B, or C", "at least one of A, B, and C", and "at least one of A, B, or C" may include any one of the items enumerated together in the corresponding phrase, among the phrases, or all possible combinations thereof.

Hereinafter, embodiments of the present disclosure will be described in detail with reference to the attached drawings.

Figure 3:
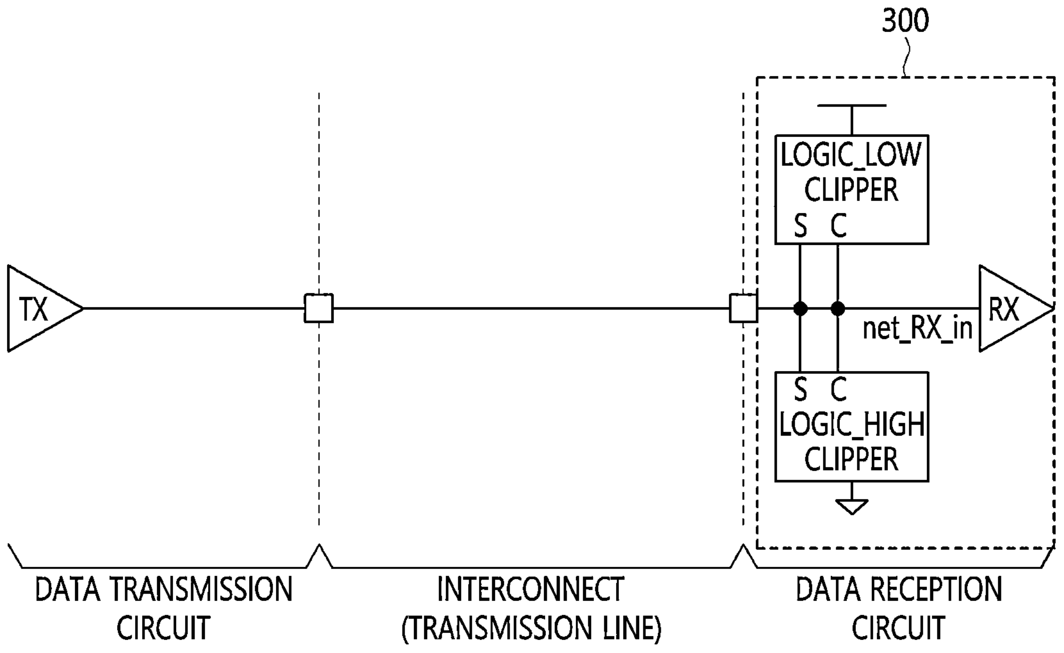
FIG. 3 is a diagram illustrating a data reception circuit according to an embodiment of the present disclosure.

FIG. 3 is a diagram illustrating a data reception circuit according to an embodiment of the present disclosure.

Specifically, FIG. 3 is a diagram illustrating an example data reception circuit unit in the configuration for one-directional transmission using an interconnect.

Referring to FIG. 3, the data reception circuit according to an embodiment of the present disclosure includes a reception circuit RX for converting a reception signal received from the interconnect into a digital signal, a first clipper circuit (logic high clipper) for suppressing an overshoot of the reception signal based on current extraction, and a second clipper circuit (logic low clipper) for suppressing an undershoot of the reception signal based on current supply.

Here, the first clipper circuit may include a first sensing port for sensing a voltage at an input terminal of the reception circuit and a first current port for transferring the current extracted from the input terminal to a ground.

Here, when the voltage at the input terminal is higher than a preset upper limit voltage, the first clipper circuit may operate to extract the current from the reception signal.

For example, referring to FIG. 3, if the overshoot occurs when a signal is received at a data reception circuit 300 via a transmission line (the interconnect), a logic high clipper circuit, which is the first clipper circuit, may sense the overshoot via an S port (a sense-port) that is a first sensing port. Then, a path may be provided through which the current flows from the input terminal net_RX_in to the ground (GND) of the first clipper circuit of the data reception circuit 300 via a C port (a current-port) that is the first current port.

Here, the first clipper circuit may correspond to any one of a type operating based on a threshold voltage, a type operating based on a level shifter, or a type operating based on an amplifier or a comparator with a reference voltage set therein.

Here, the upper limit voltage may correspond to a voltage set for determining the overshoot in a preset limit range.

Figure 4:
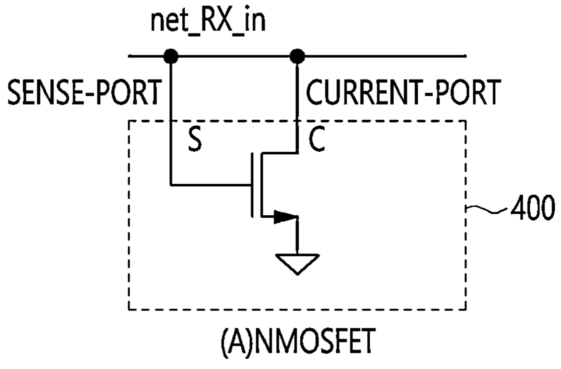
FIGS. 4 to 6 are diagrams illustrating example first clipper circuits (logic high clippers) for suppressing an overshoot shown in FIG. 3.

For example, FIG. 4 is a diagram illustrating a first clipper circuit 400 using an N-type Metal-Oxide-Semiconductor Field-Effect Transistor (NMOSFET), the threshold voltage of which corresponds to the preset upper limit voltage. Here, the voltage at the input terminal net_RX_in becomes higher than the threshold voltage (i.e., the preset upper limit value) of the NMOSFET, the NMOSFET may be turned on and the current may be extracted to flow from the input terminal net_RX_in to the GND via the C port (current-port) to suppress the overshoot. That is, the S port in the first clipper circuit 400 shown in FIG. 4 may be a gate of the NMOSFET and the C port may be a drain of the NMOSFET.

Figure 5:
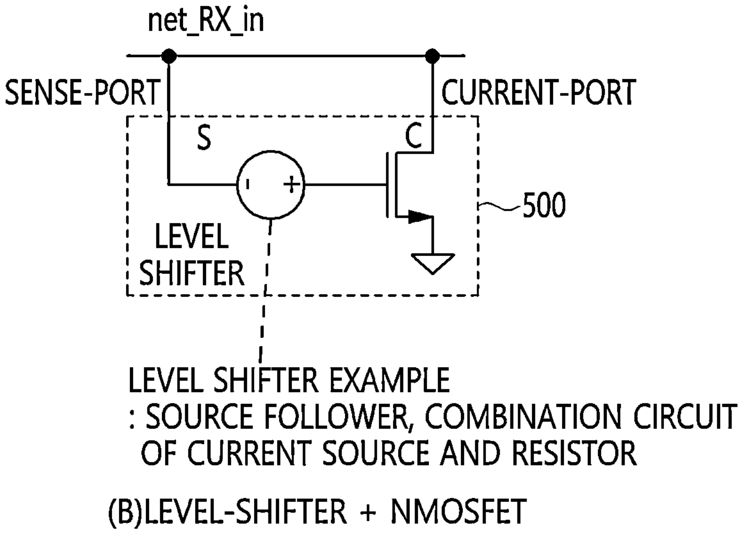

For another example, FIG. 5 is a diagram illustrating a first clipper circuit 500 using a level shifter. Here, the voltage at the input terminal net_RX_in of the data reception circuit becomes higher than the preset upper limit voltage, the voltage at the input terminal net_RX_in of the data reception circuit may turn on the NMOSFET via the level shifter to allow the current to be extracted to flow from the input terminal net_RX_in to the GND via the C port (current-port) to suppress the overshoot. That is, the S port in the first clipper circuit 500 shown in FIG. 5 may be an input of the level shifter and the C port may be the drain of the NMOSFET.

Figure 6:
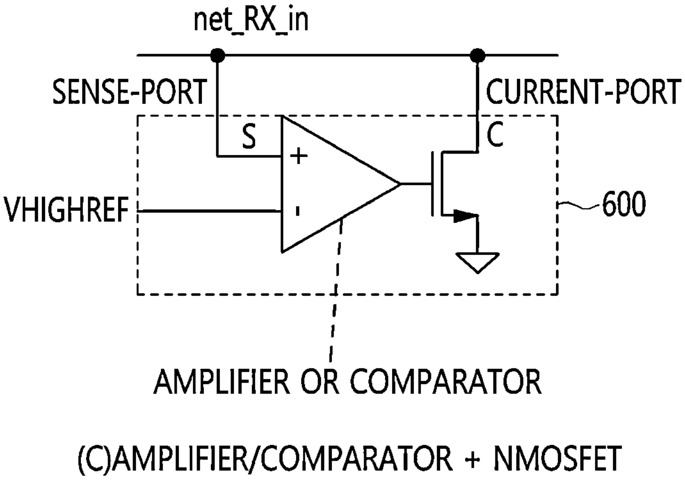

For another example, FIG. 6 is a diagram illustrating a first clipper circuit 600 using an amplifier or a comparator with a reference voltage VHIGHREF set therein. Here, when the voltage at the input terminal net_RX_in of the data reception circuit becomes higher than the reference voltage VHIGHREF, the NMOSFET may be turned on and the current may be extracted to flow from the input terminal net_RX_in to the GND via the C port (current-port) to suppress the overshoot. That is, the S port in the first clipper circuit 600 shown in FIG. 6 may be a positive input of the amplifier or the comparator and the C port may be the drain of the NMOSFET.

Here, the second clipper circuit may include a second sensing port for sensing the voltage at the input terminal of the reception circuit and a second current port for transferring the current supplied from a power supply to the input terminal.

Here, when the voltage at the input terminal is lower than a preset lower limit voltage, the second clipper circuit may operate to supply the current to the reception signal via the second current port.

For example, referring to FIG. 3, if the undershoot occurs when a signal is received at the data reception circuit 300 via the transmission line (the interconnect), a logic low clipper circuit, which is the second clipper circuit, may sense the undershoot via the S port (sense-port) that is the second sensing port. Then, a path may be provided through which the current may be supplied from the power supply to the input terminal net_RX_in of the data reception circuit 300 via the C port (current-port).

Here, the second clipper circuit may correspond to any one of a type operating based on a threshold voltage, a type operating based on the level shifter, or a type operating based on the amplifier or the comparator with the reference voltage set therein.

Here, the lower limit voltage may correspond to a voltage set for determining the undershoot in a preset limit range.

Figure 7:
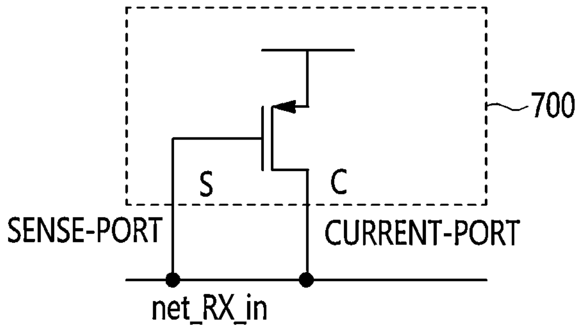
FIGS. 7 to 9 are diagrams illustrating example second clipper circuits (logic low clippers) for suppressing an undershoot shown in FIG. 3.

For example, FIG. 7 is a diagram illustrating the second clipper circuit using a P-type Metal-Oxide-Semiconductor Field-Effect Transistor (PMOSFET), the threshold voltage of which corresponds to the preset lower limit voltage. Here, when the voltage at the input terminal net_RX_in of the data reception circuit becomes lower than the threshold voltage (i.e., the preset lower limit value) of the PMOSFET, the PMOSFET may be turned on and the current may be supplied from the power supply to the input terminal net_RX_in of the data reception circuit to suppress the undershoot. That is, the S port in the second clipper circuit shown in FIG. 7 may be a gate of the PMOSFET and the C port may be a drain of the PMOSFET.

Figure 8:
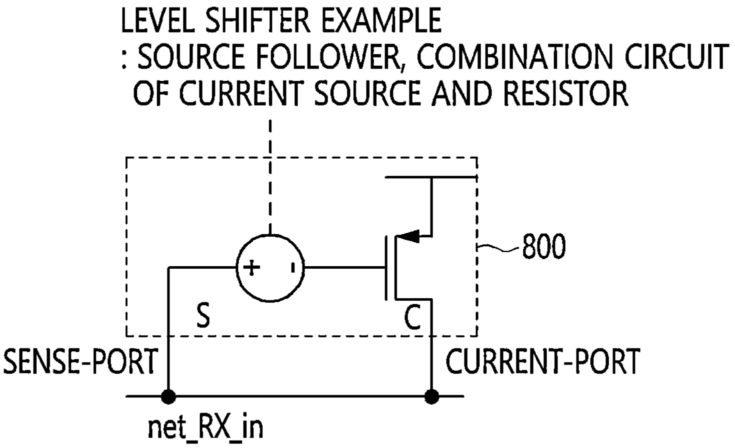

For another example, FIG. 8 is a diagram illustrating a second clipper circuit 800 using a level shifter. Here, the voltage at the input terminal net_RX_in of the data reception circuit becomes lower than the preset lower limit voltage, the voltage at the input terminal net_RX_in of the data reception circuit may turn on the PMOSFET to allow the current to be supplied from the power supply to the input terminal net_RX_in via the C port (current-port) to suppress the undershoot. That is, the S port in the second clipper circuit 800 shown in FIG. 8 may be an input of the level shifter and the C port may be the drain of the PMOSFET.

Figure 9:
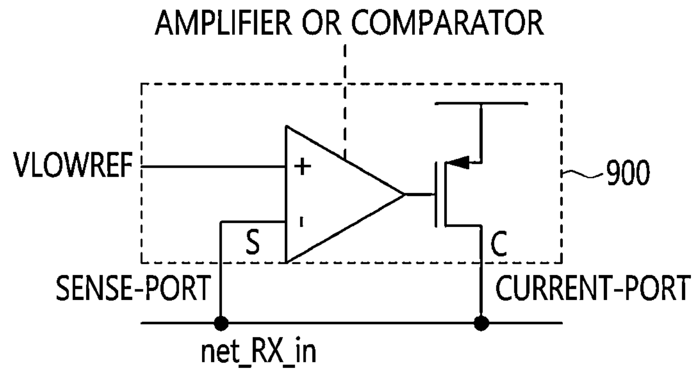

For another example, FIG. 9 is a diagram illustrating a second clipper circuit 900 using an amplifier or a comparator with a reference voltage VLOWREF set therein.

Here, when the voltage at the input terminal net_RX_in of the data reception circuit becomes lower than the reference voltage VLOWREF, the PMOSFET may be turned on and the current may be supplied via the C port (current-port) from the power supply to the input terminal net_RX_in of the data reception circuit to suppress the undershoot. Namely, the S port in the second clipper circuit 900 shown in FIG. 9 may be a negative input of the amplifier or the comparator and the C port may be the drain of the PMOSFET.

Figure 2:
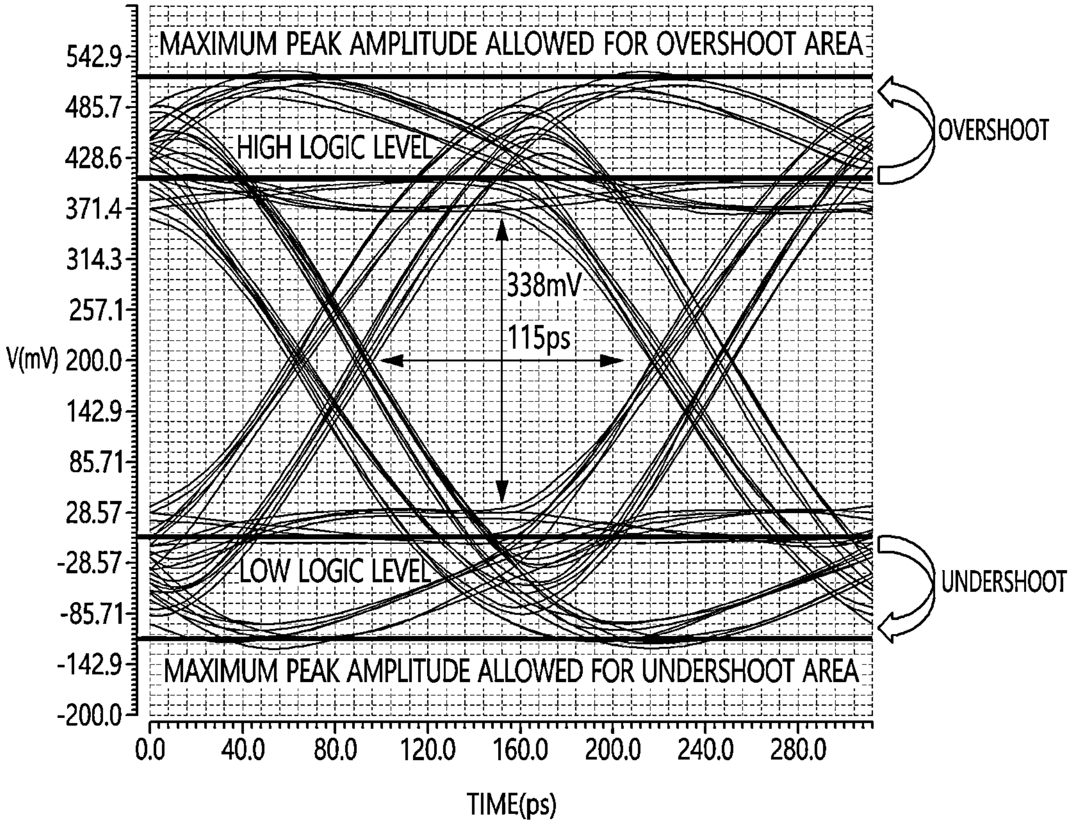
FIG. 2 is a diagram illustrating an example in which an overshoot and an undershoot occur due to under-damping characteristics during high-speed data transmission and reception.
Figure 10:
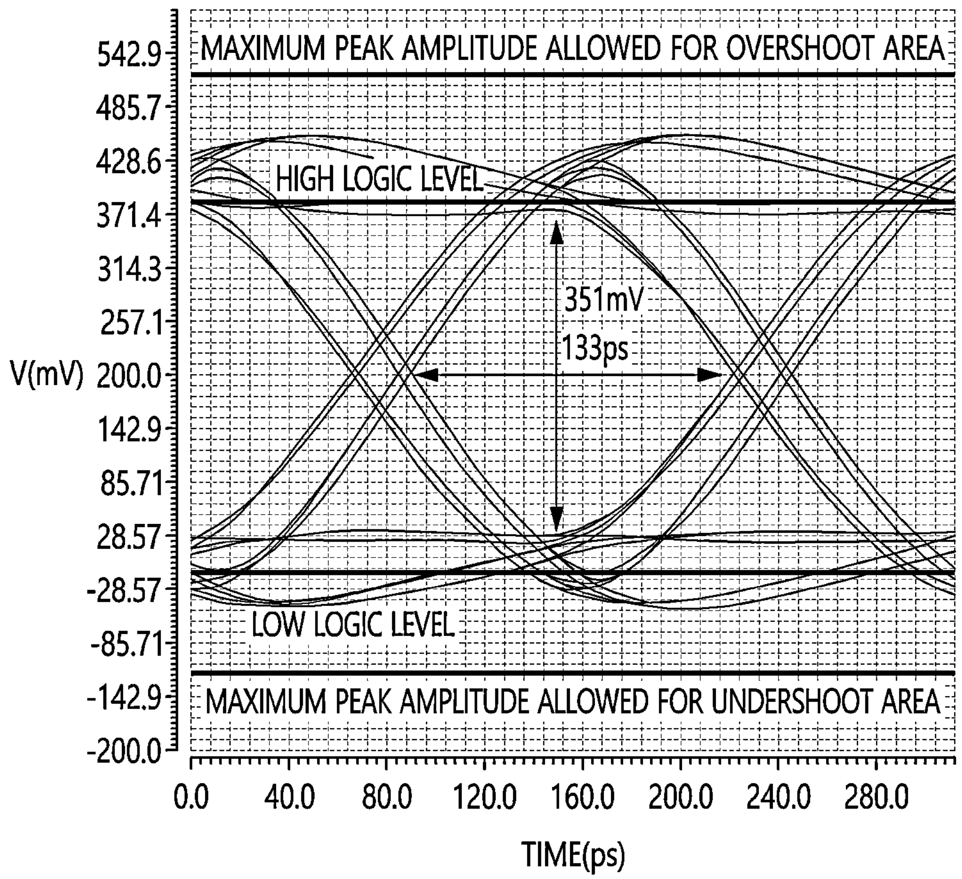
FIG. 10 is a diagram illustrating an example in which the first clipper circuit shown in FIG. 4 and the second clipper circuit shown in FIG. 7 are applied to a reception circuit for showing an eye-diagram of FIG. 2.

Here, FIG. 10 is a diagram illustrating a test result of applying the first clipper circuit 400 shown in FIG. 4 and the second clipper circuit 700 shown in FIG. 7 to the reception circuit showing the eye-diagram of FIG. 2. Referring to FIG. 10, it may be confirmed that an overshoot and an undershoot respectively deviated from a high logic level and a low logic level that are the limit ranges in FIG. 2 are suppressed to be within the limit ranges. Furthermore, it may be confirmed that the eye-diagram of FIG. 10 is expanded in comparison to that of FIG. 2.

Figure 11:
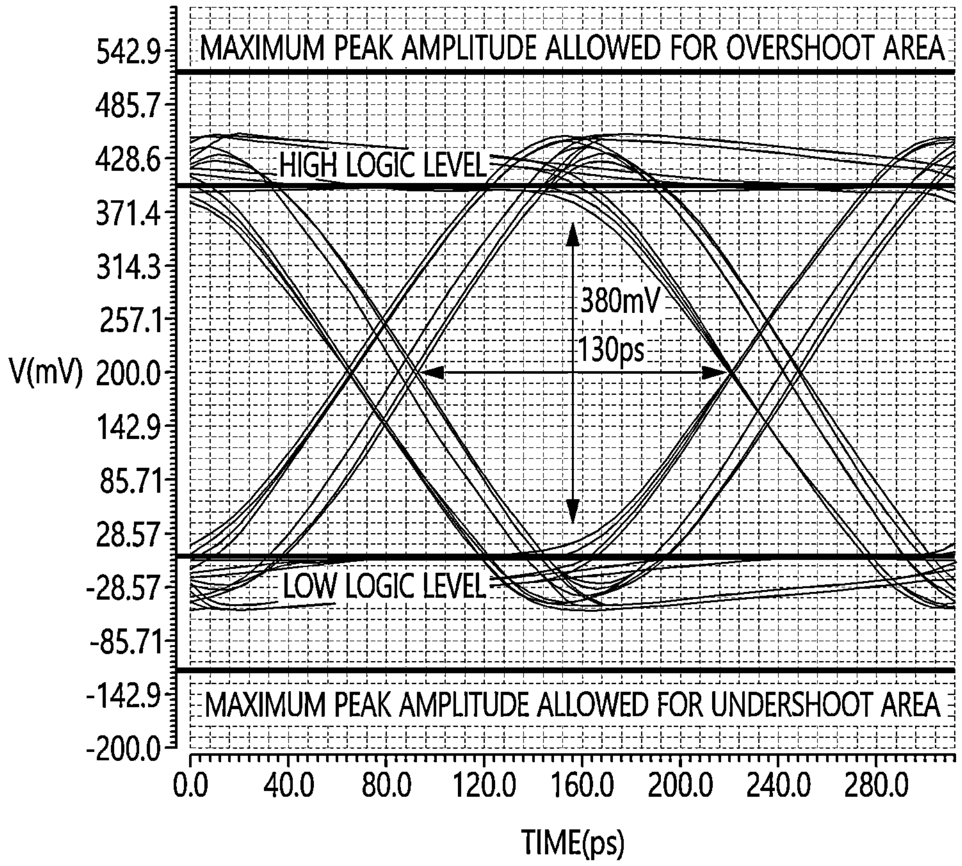
FIG. 11 is a diagram illustrating an example in which the first clipper circuit shown in FIG. 6 and the second clipper circuit shown in FIG. 9 are applied to a reception circuit for showing an eye-diagram of FIG. 2.
Figure 12:
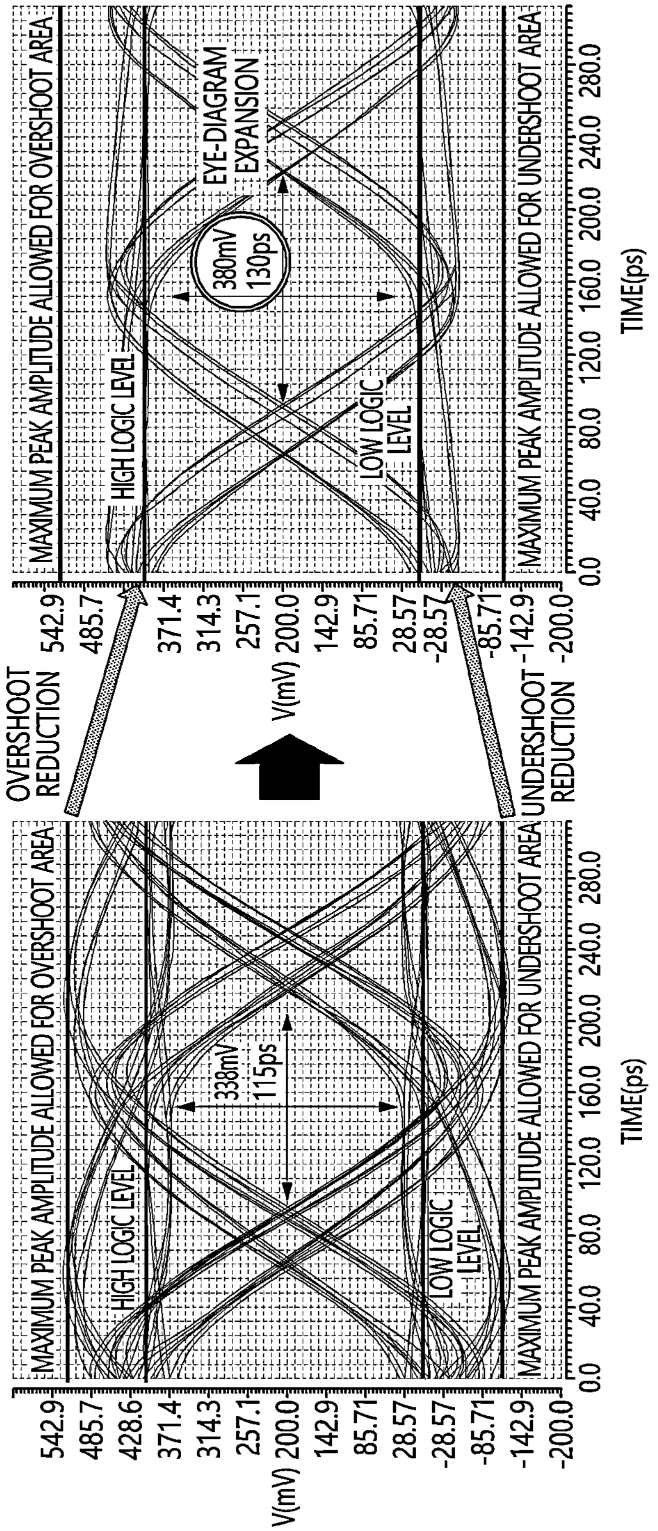
FIG. 12 is a diagram illustrating an example in which the overshoot and the undershoot are reduced and the eye-diagram is expanded according to an application of the present disclosure.

Furthermore, FIG. 11 is a diagram illustrating a test result of applying the first clipper circuit 600 shown in FIG. 6 and the second clipper circuit 900 shown in FIG. 9 to the reception circuit showing the eye-diagram of FIG. 2. Referring to FIG. 11, it may be confirmed that the overshoot and undershoot respectively deviated from a high logic level and a low logic level that are the limited ranges in FIG. 2 are suppressed to be within the limit ranges. Furthermore, it may be confirmed that the eye-diagram of FIG. 11 is expanded in comparison to that of FIG. 2.

In this way, during the high-speed data transmission and reception via high density die-to-die interconnects via the data reception circuit, the present disclosure serves a function of suppressing the overshoot and the undershoot in the I/O circuit in an IC to improve the stability of transmission signals and the reliability of the IC.

Figure 13:
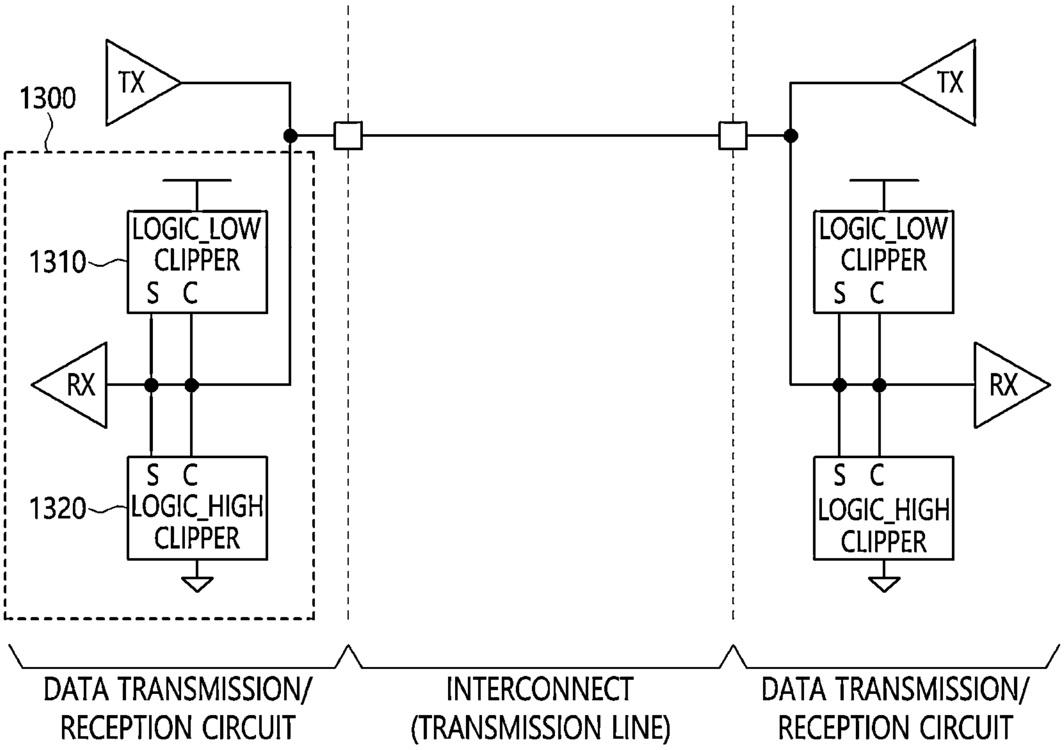
FIG. 13 is a diagram illustrating a data transmission/reception circuit according to an embodiment of the present disclosure.

FIG. 13 is a diagram illustrating a data transmission/reception circuit according to an embodiment of the present disclosure.

Specifically, FIG. 13 is a diagram illustrating a data reception circuit unit in the configuration of a bidirectional I/O circuit in which a transmission circuit TX and a reception circuit RX are connected together to one interconnect.

Referring to FIG. 13, the data reception circuit 1300 according to an embodiment of the present disclosure includes the reception circuit RX for converting a reception signal received from the interconnect into a digital signal, a first clipper circuit (logic high clipper) 1320 for suppressing an overshoot of the reception signal based on current extraction, and a second clipper circuit (logic low clipper) 1310 for suppressing an undershoot of the reception signal based on current supply.

Here, the data reception circuit 1300 shown in FIG. 13 operates in the same way as the data reception circuit shown in FIG. 3 and thus detailed description thereof will be omitted.

Figure 14:
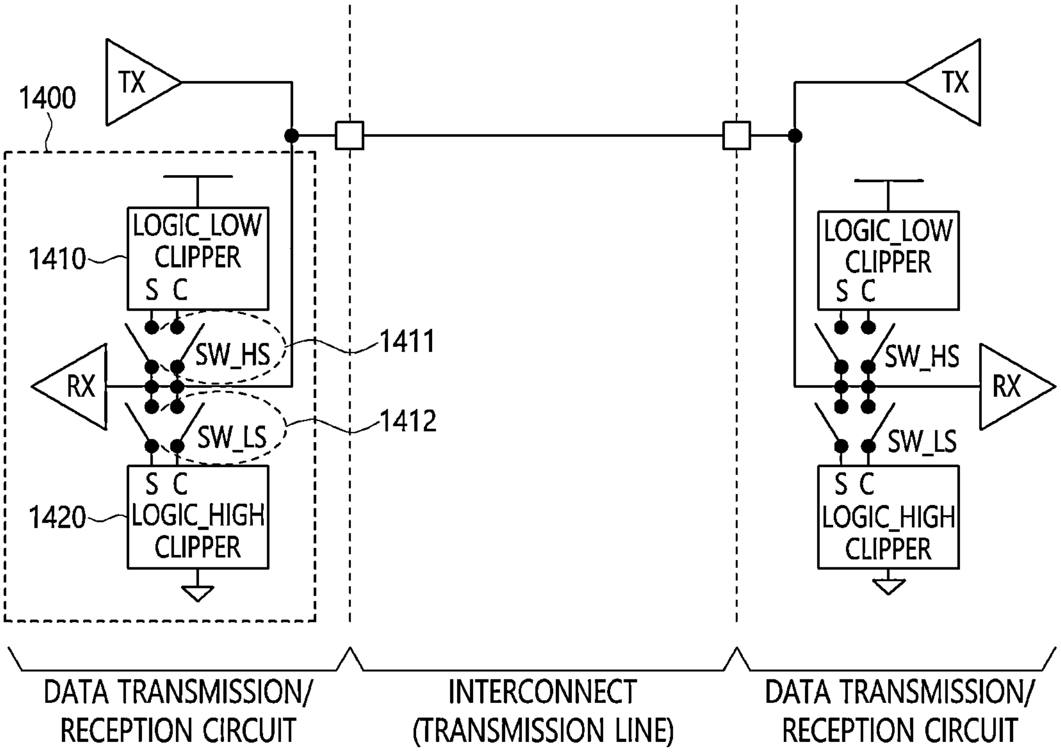
FIG. 14 is a diagram illustrating a data transmission/reception circuit including switches according to an embodiment of the present disclosure.

FIG. 14 is a diagram illustrating a data transmission/reception circuit including switches according to an embodiment of the present disclosure.

Specifically, FIG. 14 is a diagram illustrating the data reception circuit unit in the configuration of the bidirectional I/O circuit in which the transmission circuit TX and the reception circuit RX are connected together to one interconnect.

Referring to FIG. 14, the data reception circuit 1400 according to an embodiment of the present disclosure includes the reception circuit RX for converting a reception signal received from the interconnect into a digital signal, a first clipper circuit (logic high clipper) 1420 for suppressing an overshoot of the reception signal based on current extraction, and a second clipper circuit (logic low clipper) 1410 for suppressing an undershoot of the reception signal based on current supply.

Here, during the operation of the reception circuit, the data reception circuit 1400 may further include switches 1412 and 1411 for connecting the first clipper circuit 1420 and the second clipper circuit 1410 to an input terminal of the reception circuit.

For example, when the switch 1412 is closed, the first clipper circuit 1420 may be connected to the input terminal of the reception circuit, and when the switch 1411 is closed, the second clipper circuit 1410 may be connected to the input terminal of the reception circuit.

Here, the switch may be closed during the operation of the reception circuit and opened during the operation of the transmission circuit. In this way, in an environment of the bidirectional I/O circuit in which the transmission circuit TX and the reception circuit RX are connected together, when the transmission circuit operates, a parasite element may be disconnected by opening the switches and disconnecting the first clipper circuit 1420 and the second clipper circuit 1410.

Here, when the switches are closed, the data reception circuit 1400 shown in FIG. 14 operates in the same way as the data reception circuit shown in FIG. 3 and thus detailed description thereof will be omitted.

Figure 15:
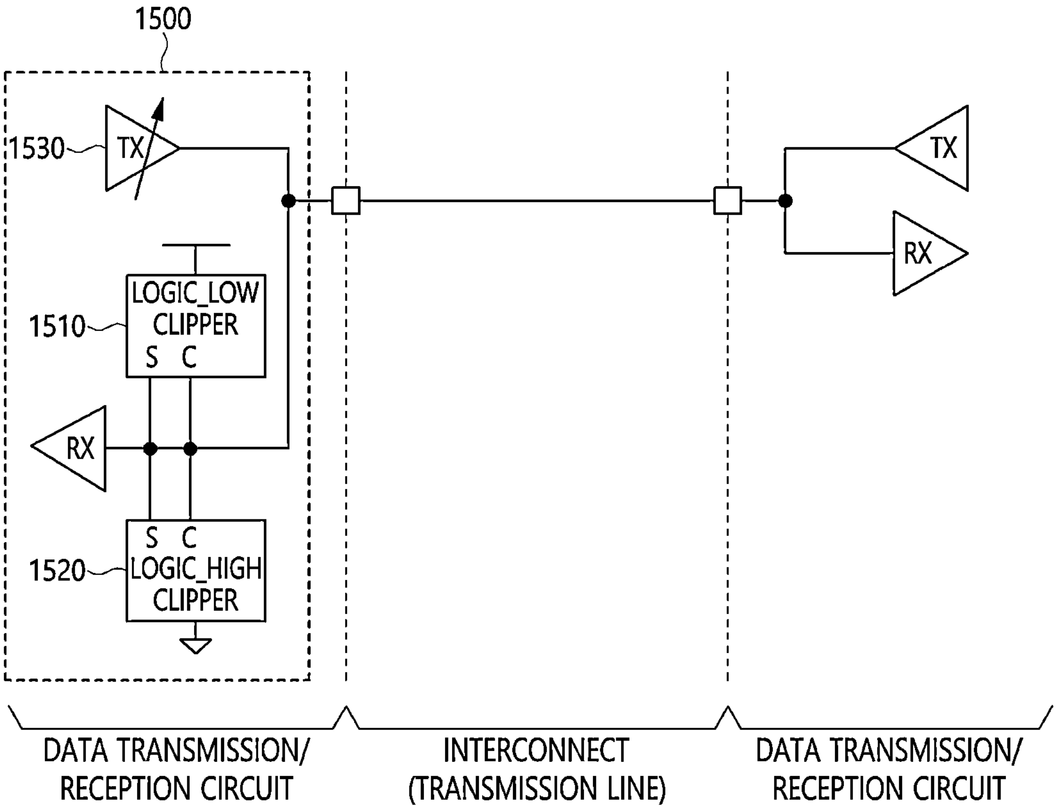
FIG. 15 is a diagram illustrating a data transmission/reception circuit including a transmission circuit capable of adjusting an output impedance according to an embodiment of the present disclosure.

FIG. 15 is a diagram illustrating a data transmission/reception circuit including a transmission circuit capable of adjusting an output impedance according to an embodiment of the present disclosure.

Specifically, FIG. 15 is a diagram illustrating a case in which the present disclosure may be applied to only one point in the configuration of the bidirectional I/O circuit in which the transmission circuit TX and the reception circuit RX are connected together to one interconnect.

Referring to FIG. 15, the data transmission/reception circuit 1500 according to an embodiment of the present disclosure includes a transmission circuit TX 1530 for transmitting a transmission signal to the interconnect, a reception circuit RX for converting a reception signal from the interconnect into a digital signal, a first clipper circuit (logic high clipper) 1520 for suppressing an overshoot of the reception signal based on current extraction, and a second clipper circuit (logic low clipper) 1510 for suppressing an undershoot of the reception signal based on current supply.

Here, when an overshoot and an undershoot are not suppressible in a reception stage for receiving the transmission signal, the transmission circuit 1530 may adjust an output impedance based on a resistance value.

For example, the variable output impedance transmission circuit 1530 shown in FIG. 15 may serve a function of reducing under-damping characteristics to limit the overshoot and the undershoot by increasing the resistance value.

Here, the data reception circuit shown in FIG. 15 operates in the same way as the data reception circuit shown in FIG. 3 and thus detailed description thereof will be omitted.

Figure 16:
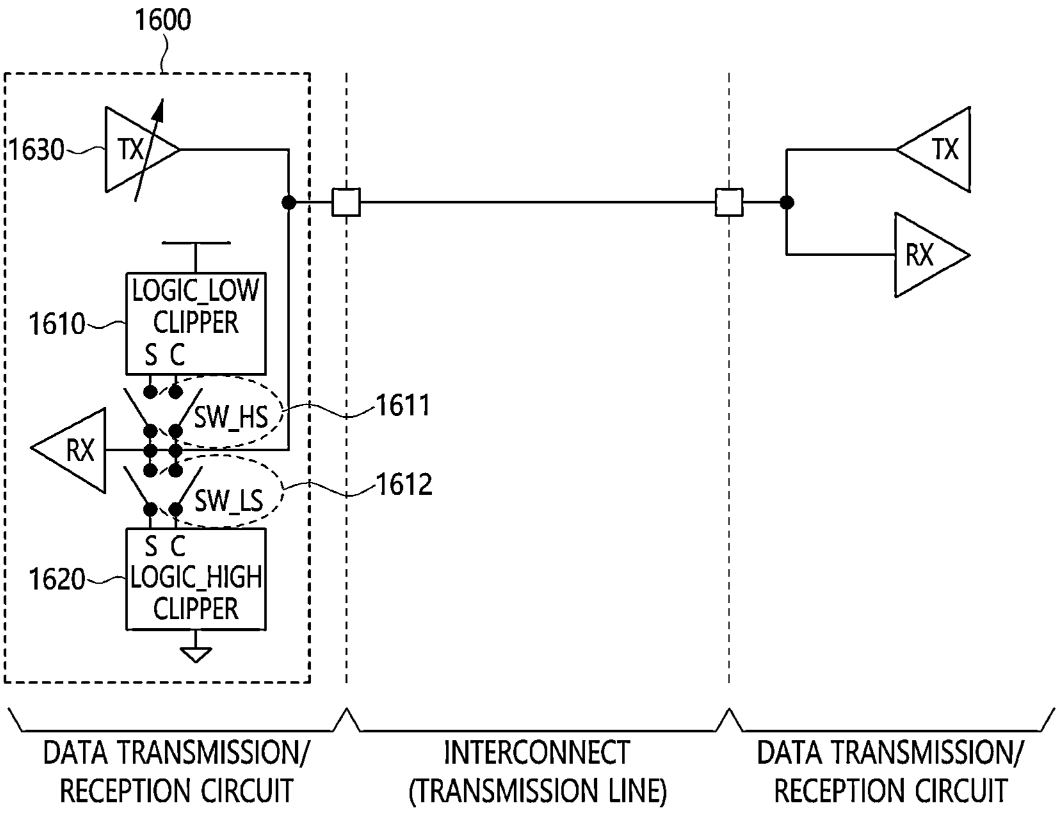
FIG. 16 is a diagram illustrating a data transmission/reception circuit including switches and a transmission circuit capable of adjusting an output impedance according to an embodiment of the present disclosure.

FIG. 16 is a diagram illustrating a data transmission/reception circuit including switches and a transmission circuit capable of adjusting an output impedance according to an embodiment of the present disclosure.

Specifically, FIG. 16 is a diagram illustrating a case in which the present disclosure may be applied to only one point in the configuration of the bidirectional I/O circuit in which the transmission circuit TX and the reception circuit RX are connected together to one interconnect.

Referring to FIG. 16, a data transmission/reception circuit 1600 according to an embodiment of the present disclosure includes a transmission circuit TX 1630 for transmitting a transmission signal to the interconnect, a reception circuit RX for converting a reception signal received from the interconnect into a digital signal, a first clipper circuit (logic high clipper) 1620 for suppressing an overshoot of the reception signal based on current extraction, and a second clipper circuit (logic low clipper) 1610 for suppressing an undershoot of the reception signal based on current supply.

Here, during the operation of the reception circuit, the data reception circuit RX may further include switches 1612 and 1611 for connecting the first clipper circuit 1620 and the second clipper circuit 1610 to an input terminal of the reception circuit.

For example, when the switch 1612 is closed, the first clipper circuit 1620 may be connected to the input terminal of the reception circuit, and when the switch 1611 is closed, the second clipper circuit 1610 may be connected to the input terminal of the reception circuit.

Here, the switch may be closed during the operation of the reception circuit and opened during the operation of the transmission circuit. In this way, in an environment of the bidirectional I/O circuit in which the transmission circuit TX and the reception circuit RX are connected together, when the transmission circuit operates, a parasite element may be disconnected by opening the switches and disconnecting the first clipper circuit 1620 and the second clipper circuit 1610.

Here, when the overshoot and the undershoot are not suppressible in a reception stage for receiving the transmission signal, the transmission circuit 1630 may adjust an output impedance based on a resistance value.

For example, the variable output impedance transmission circuit 1630 shown in FIG. 16 may serve a function of reducing under-damping characteristics to limit the overshoot and the undershoot by increasing the resistance value.

Here, when the switches are closed, the data reception circuit RX shown in FIG. 16 operates in the same way as the data reception circuit shown in FIG. 3 and thus detailed description thereof will be omitted.

According to the present disclosure, an overshoot and an undershoot caused by under-damping characteristics may be suppressed during high-speed data transmission and reception via the die-to-die interconnect.

In addition, the stability of transmission signals and the reliability of an integrated circuit may be improved by suppressing an overshoot and an undershoot in an I/O circuit of the integrated circuit.

As described above, in the high-speed I/O circuit for the die-to-die interconnect for suppressing the overshoot and the undershoot according to the present disclosure, the configurations and schemes in the above-described embodiments are not limitedly applied, and some or all of the above embodiments can be selectively combined and configured so that various modifications are possible.

What is claimed is:

1. A data reception circuit, comprising:
a reception circuit configured to convert a reception signal received from an interconnect into a digital signal;
a first clipper circuit configured to suppress an overshoot of the reception signal based on current extraction; and
a second clipper circuit configured to suppress an undershoot of the reception signal based on current supply,
wherein the first clipper circuit comprises:
a first sensing port configured to sense a voltage at an input terminal of the reception circuit; and
a first current port configured to transfer a current extracted from the input terminal to a ground,
wherein when the voltage at the input terminal is higher than a preset upper limit voltage, the first clipper circuit operates to extract the current from the reception signal via the first current port.

2. The data reception circuit of claim 1, wherein the first clipper circuit corresponds to any one of a type operating based on a threshold voltage, a type operating based on a level shifter, or a type operating based on an amplifier or a comparator with a reference voltage set therein.

3. The data reception circuit of claim 1, wherein the upper limit voltage corresponds to a voltage set for determining the overshoot in a preset limit range.

4. The data reception circuit of claim 1,
wherein the second clipper circuit comprises:
a second sensing port configured to sense a voltage at an input terminal of the reception circuit; and
a second current port configured to transfer a current supplied from a power supply to the input terminal,
wherein when the voltage at the input terminal is lower than a preset lower limit voltage, the second clipper circuit operates to supply the current to the reception signal via the second current port.

5. The data reception circuit of claim 4, wherein the second clipper circuit corresponds to any one of a type operating based on a threshold voltage, a type operating based on a level shifter, or a type operating based on an amplifier or a comparator with a reference voltage set therein.

6. The data reception circuit of claim 4, wherein the lower limit voltage corresponds to a voltage set for determining the undershoot in a preset limit range.

7. A data transmission/reception circuit, comprising:
a transmission circuit configured to transmit a transmission signal to an interconnect;
a reception circuit configured to convert a reception signal received from the interconnect into a digital signal;
a first clipper circuit configured to suppress an overshoot of the reception signal based on current extraction;
a second clipper circuit configured to suppress an undershoot of the reception signal based on current supply; and
a switch configured to connect the first clipper circuit and the second clipper circuit to an input terminal of the reception circuit during an operation of the reception circuit;
wherein the switch is closed during the operation of the reception circuit and opened during an operation of the transmission circuit.

8. The data transmission/reception circuit of claim 7, wherein the first clipper circuit comprises:
a first sensing port configured to sense a voltage at an input terminal of the reception circuit; and
a first current port configured to transfer the current extracted from the input terminal to a ground,
wherein when the voltage at the input terminal is higher than a preset upper limit voltage, the first clipper circuit operates to extract the current from the reception signal via the first current port.

9. The data transmission/reception circuit of claim 8, wherein the first clipper circuit corresponds to any one of a type operating based on a threshold voltage, a type operating based on a level shifter, or a type operating based on an amplifier or a comparator with a reference voltage set therein.

10. The data transmission/reception circuit of claim 8, wherein the upper limit voltage corresponds to a voltage set for determining the overshoot in a preset limit range.

11. The data transmission/reception circuit of claim 7, wherein the second clipper circuit comprises:
a second sensing port configured to sense a voltage at an input terminal of the reception circuit; and
a second current port configured to transfer a current supplied from a power supply to the input terminal,
wherein when the voltage at the input terminal is lower than a preset lower limit voltage, the second clipper circuit operates to supply the current to the reception signal via the second current port.

12. The data transmission/reception circuit of claim 11, wherein the second clipper circuit corresponds to any one of a type operating based on a threshold voltage, a type operating based on a level shifter, or a type operating based on an amplifier or a comparator with a reference voltage set therein.

13. The data transmission/reception circuit of claim 11, wherein the lower limit voltage corresponds to a voltage set for determining the undershoot in a preset limit range.

14. A data transmission/reception circuit, comprising:

a transmission circuit configured to transmit a transmission signal to an interconnect;

a reception circuit configured to convert a reception signal received from the interconnect into a digital signal;

a first clipper circuit configured to suppress an overshoot of the reception signal based on current extraction; and a second clipper circuit configured to suppress an undershoot of the reception signal based on current supply, wherein the transmission circuit adjusts an output impedance based on a resistance value when an overshoot and undershoot are not suppressible in a reception stage for receiving the transmission signal.

* * * * *